United States Patent
Rife

(10) Patent No.: US 6,343,012 B1
(45) Date of Patent: Jan. 29, 2002

(54) HEAT DISSIPATION DEVICE WITH THREADED FAN MODULE

(75) Inventor: William B. Rife, Cranston, RI (US)

(73) Assignee: Tyco Electronics Logistis AG, Steinach (CH)

( * ) Notice: Subject to any disclaimer, the term of this patent is extended or adjusted under 35 U.S.C. 154(b) by 0 days.

(21) Appl. No.: 09/711,473

(22) Filed: Nov. 13, 2000

(51) Int. Cl.⁷ ................................................ H05U 7/20
(52) U.S. Cl. ........................ 361/695; 361/690; 361/694; 257/721; 257/718; 257/719; 174/16.1; 165/80.2; 165/185
(58) Field of Search ................................ 361/690, 694, 361/695, 704, 709, 710, 717–719; 257/706, 718, 719, 721, 722, 727; 174/15.1, 16.1, 16.3; 165/80.2, 80.3, 185, 104.33, 104.34

(56) References Cited

U.S. PATENT DOCUMENTS

| | | | |
|---|---|---|---|
| 2,432,513 A | 12/1947 | Depew | 250/27.5 |
| 2,916,159 A | 12/1959 | O'Neill | 211/89 |
| 2,958,515 A | 11/1960 | Booher | 257/263 |
| 3,033,537 A | 5/1962 | Brown, Jr. | 257/263 |
| 3,146,384 A | 8/1964 | Ruehle | 317/234 |
| 3,182,114 A | 5/1965 | Burgess et al. | 174/15 |
| 3,229,756 A | 1/1966 | Keresztury | 165/67 |
| 3,417,300 A | 12/1968 | Kauffman | 317/234 |
| 4,481,525 A | 11/1984 | Calabro et al. | 357/81 |
| 4,576,224 A | 3/1986 | Eaton et al. | 165/80.2 |
| 4,607,685 A | 8/1986 | Mitchell, Jr. | 165/80.3 |
| 4,745,456 A * | 5/1988 | Clemens | 165/80.2 |
| 4,753,287 A | 6/1988 | Horne | 165/80.3 |
| 4,924,352 A | 5/1990 | Septfons | 361/388 |
| 5,170,323 A | 12/1992 | Perretta et al. | 361/386 |
| 5,313,099 A * | 5/1994 | Tata et al. | 257/717 |
| 5,945,736 A * | 8/1999 | Rife et al. | 257/719 |
| 6,014,315 A * | 1/2000 | McCullough et al. | 361/704 |
| 6,021,045 A * | 2/2000 | Johnson | 361/704 |
| 6,075,699 A * | 6/2000 | Rife | 361/704 |
| 6,093,961 A * | 7/2000 | McCullough | 257/718 |
| 6,116,120 A * | 9/2000 | Boe | 81/163 |
| 6,236,569 B1 * | 5/2001 | McEuen | 361/719 |

* cited by examiner

Primary Examiner—Leo P. Picard
Assistant Examiner—Boris L. Chervinsky
(74) Attorney, Agent, or Firm—Barlow, Josephs & Holmes, Ltd

(57) ABSTRACT

A heat dissipation device for removing heat from an electronic device package includes a retaining clip having a central member and a first pair of legs depending downwardly therefrom. The retaining clip has a bore with female threading therein. Free ends of the legs are secured to the semiconductor device package. A fan module, having a threaded base portion with a lower edge; is threadably received in the bore of the retaining clip so that the lower edge of the fan module remains in communication with the upper surface of the semiconductor package. As a result, the fan module is secured to the semiconductor device for removing heat therefrom.

7 Claims, 6 Drawing Sheets

HEAT DISSIPATION DEVICE WITH THREADED FAN MODULE

BACKGROUND OF THE INVENTION

The present invention relates generally to electronic solid state and integrated circuit devices. More specifically, the present invention relates to apparatuses for dissipating heat generated by such devices.

In the electronics and computer industries, it has been well known to employ various types of electronic device packages and integrated circuit chips, such as the PENTIUM central processing unit chip (CPU) manufactured by Intel Corporation and RAM (random access memory) chips. These integrated circuit chips have a pin grid array (PGA) package and are typically installed into a socket which is soldered to a computer circuit board. These integrated circuit devices, particularly the CPU microprocessor chips, generate a great deal of heat during operation which must be removed to prevent adverse effects on operation of the system into which the device is installed. For example, a PENTIUM microprocessor, containing millions of transistors, is highly susceptible to overheating which could destroy the microprocessor device itself or other components proximal to the microprocessor.

In addition to the PENTIUM microprocessor discussed above, there are many other types of semiconductor device packages which are commonly used in computer equipment, for example. Recently, various types of surface mount packages, such as BGA (ball grid array) and LGA (land grid array) type semiconductor packages have become increasingly popular as the semiconductor package of choice for computers. For example, many microprocessors manufactured by the Motorola Corporation, for use in Apple Corporation computers, employ BGA-type packages. Unlike a PENTIUM microprocessor with a PGA package, which has pins to be installed into a receiving socket, BGA and LGA semiconductor packages include an array of electrical contacts on their bottom surfaces to engage directly with an array of receiving electrical contacts on a circuit board, socket or the like.

In similar fashion to the PENTIUM-type semiconductor devices discussed above, the BGA, LGA and related device packages also suffer from excessive generation of heat. If such heat is not properly dissipated, the chip will eventually fail. As a result, efforts have been made to supply a heat dissipating member, such as a heat sink, into thermal communication with the semiconductor device package, such as a BGA or LGA chip. These heat sinks are commonly machined out of a thermally conductive metallic material and include fins or pins to improve heat dissipation of the heat sink. To improve air flow through these heat sinks, electric fans are commonly affixed directly to the heat sink.

However, in many applications, all that is needed to avoid device failure is improved air flow over the device itself. An additional heat sink assembly is not required. Improved air flow over a device that runs hot and is in need of cooling is commonly achieved by employing motherboard design where the device to be cooled is located at a computer case vent or near the exhaust of a fan, such as one for a power supply within a computer. Since foregoing attempts to bring cooling air over a semiconductor device are difficult to control and are often not matched to the cooling needs of the semiconductor device to be cooled, it is preferably that a separate air flow source be dedicated to the semiconductor device to be cooled.

In the prior art, dedicated air flow to a semiconductor device may be achieved by affixing a fan, such as a ball bearing fan, directly to or proximal to the semiconductor device. However, know fan assemblies and modules are not easily attached directly to a semiconductor device or a socket into which it is installed. Known fan assemblies must either bolted or glued to the semiconductor device for cooling it.

In view of the foregoing, there is a demand for a fan assembly that can be easily affixed to a semiconductor device to be cooled. There is a demand for a fan assembly that is dedicated to a semiconductor device for cooling it. In addition, there is demand for a fan assembly that can be securely affixed to a semiconductor device without the use of fasteners or adhesive.

SUMMARY OF THE INVENTION

The present invention preserves the advantages of prior art heat dissipation devices for semiconductor devices, such as microprocessors and RAM chips. In addition, it provides new advantages not found in currently available heat dissipation devices and overcomes many disadvantages of such currently available devices.

The heat dissipation device, for removing heat from an electronic device package, includes a retaining clip having a central member and a first pair of legs depending downwardly therefrom. The retaining clip has a bore with female threading therein. Free ends of the legs are secured to the semiconductor device package. A fan module, having a threaded base portion with a lower edge; is threadably received in the bore of the retaining clip so that the lower edge of the fan module remains in communication with the upper surface of the semiconductor package. As a result, the fan module is secured to the semiconductor device for removing heat therefrom.

In operation, the device is affixed to a semiconductor device by installing the retainer clip over the semiconductor device to be cooled. The retaining clip may be either snapped over the top of the semiconductor device or slid over the semiconductor device from the side. Once the retaining clip is in place over the semiconductor device to be cooled, the fan module with threaded base member is threadably inserted into the bore in the retaining clip. The base is threaded toward the semiconductor device so that the bottom edge of the fan module communicates with the top surface of the semiconductor device. The retaining clip elevates off of the semiconductor device slightly as the fan module is tighten down against the forces of the structure used to secure the retaining clip relative the semiconductor device, such as inwardly turned lips. Alternatively, apertures on the legs of the retaining clip that are respectively engaged with protrusions emanating from a socket into which the semiconductor device is installed. As a result, the heat dissipation device of the present invention can be easily installed without fasteners or adhesive and can be easily removed if necessary.

It is therefore an object of the present to provide a heat dissipation device that can accommodate a wide array of semiconductor device packages.

Another object of the present invention is to provide a heat dissipation device that can provide a dedicated air flow source to a semiconductor device to be cooled.

It is a further object of the present invention to provide a heat dissipation device that can be secured to a semiconductor device without fasteners or adhesive.

It is a further object of the present invention to provide a heat dissipation device that can be easily removed.

BRIEF DESCRIPTION OF THE DRAWINGS

The novel features which are characteristic of the present invention are set forth in the appended claims. However, the invention's preferred embodiments, together with further objects and attendant advantages, will be best understood by reference to the following detailed description taken in connection with the accompanying drawings in which:

DETAILED DESCRIPTION OF THE PREFERRED EMBODIMENT

Figure 7:
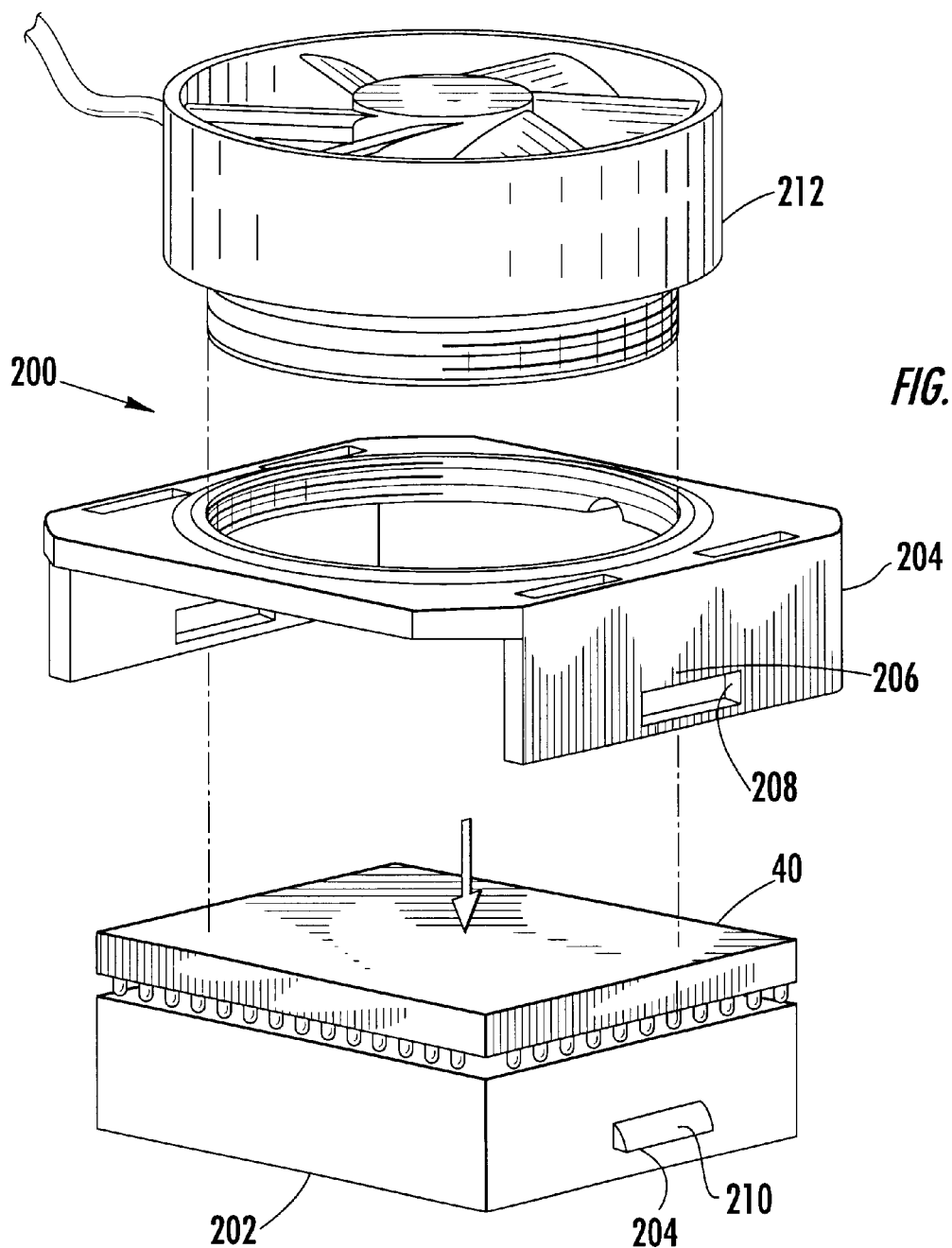
FIG. 7 is another alternative embodiment of the heat sink assembly of the present invention with windowed legs for connecting to a semiconductor device socket.

By way of example and for illustration purposes only, the present invention is shown to provide heat dissipating for a PGA-type (pin grid array) semiconductor device package. It should be understood that various other types of semiconductor packages may be employed within and accommodated by the present invention. As stated above, various semiconductor packages are available such BGA and LGA designs and may be microprocessors or RAM memory chips. The present invention can accommodate all of the aforementioned package designs. Further, various types of socket and contact arrays may be employed and still be within the scope of the present invention. For ease of illustration, the following description relates to employment of the present invention for a PGA semiconductor device package also installed in a ZIF (zero insertion force) socket, as shown in FIG. 7.

Figure 1:
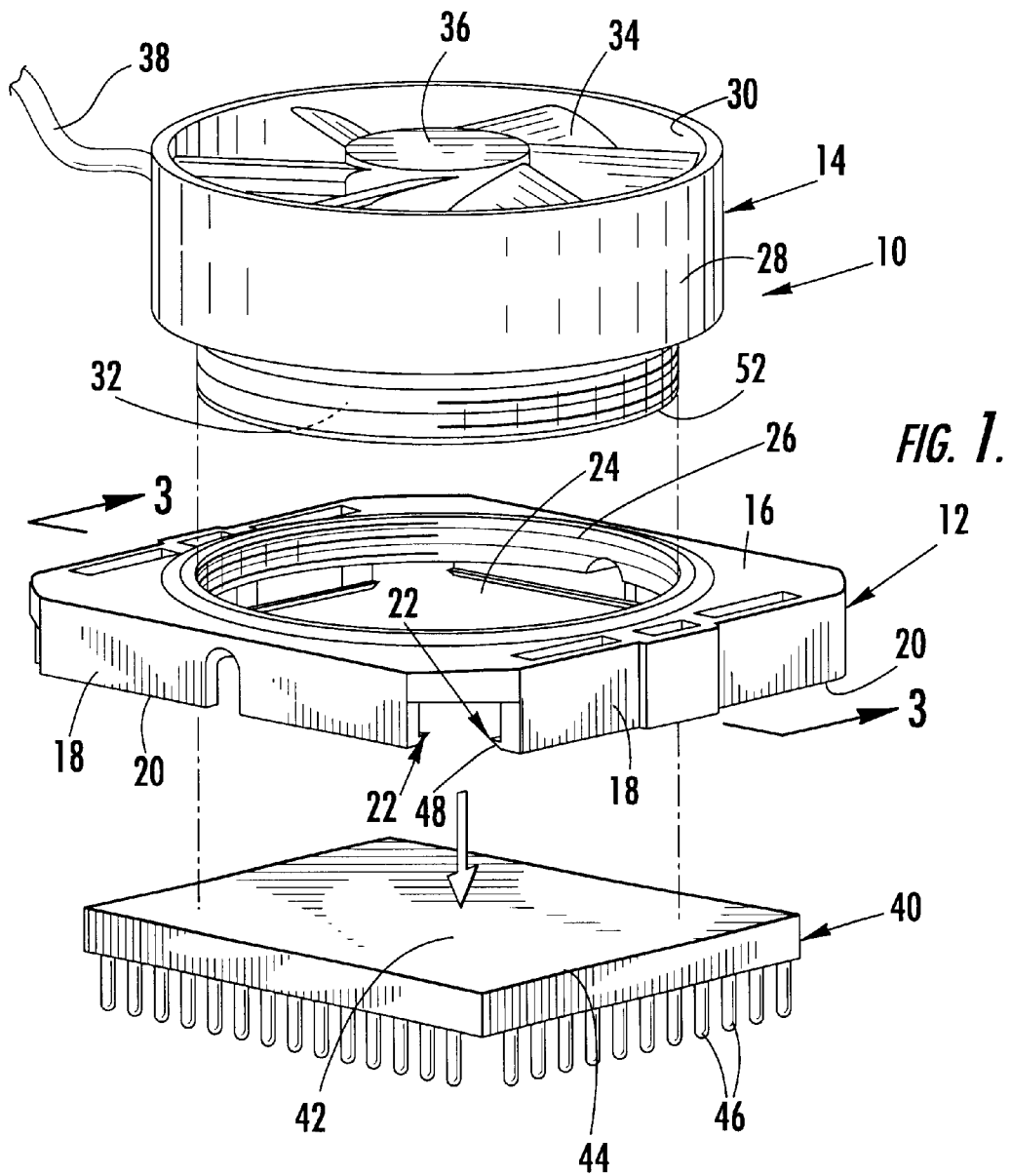
FIG. 1 is an exploded perspective view of the heat sink assembly with threaded fan module of the present invention being installed on a semiconductor device.

Referring to FIG. 1, the preferred embodiment of the heat dissipation device 10 of the present invention is shown. The heat dissipation device 10 includes a retaining clip 12 and fan module 14. In this preferred embodiment, the retaining clip 12 has a central member 16 and four pairs of legs 18 downwardly depending therefrom. Each of the legs 18 have a free end 20 at which is positioned an inwardly turned lip or flange 22. Positioned through the central member 16 is a bore 24 with female threading 26 thereon.

Figure 4:
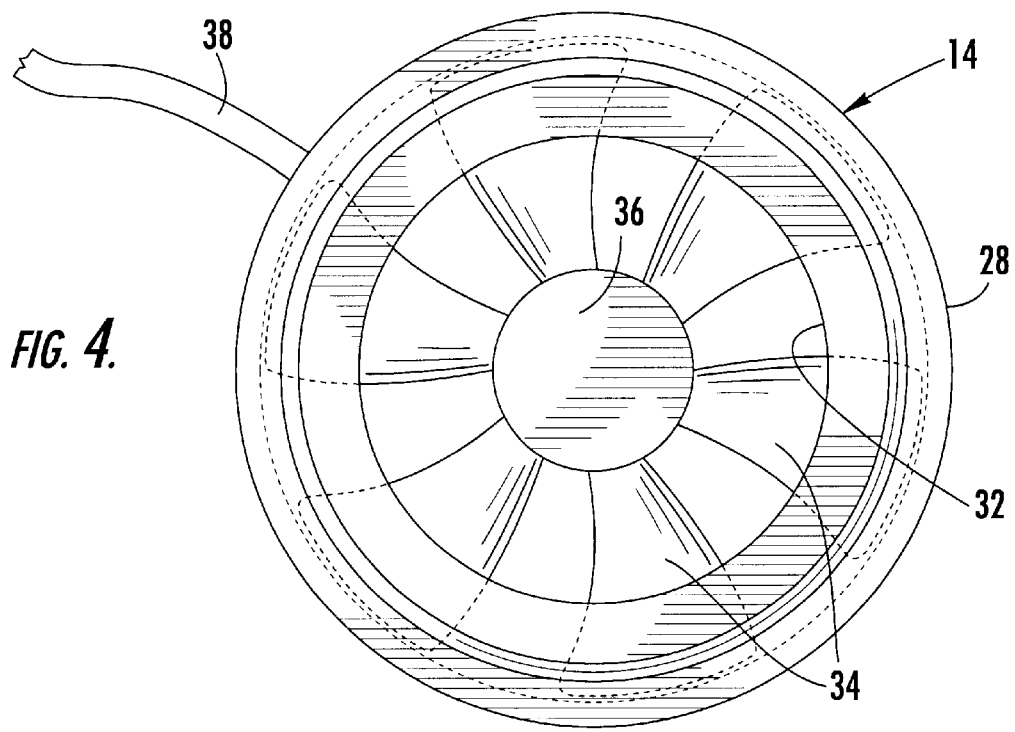
FIG. 4 is a bottom view of the fan module employed in the present invention.
Figure 5:
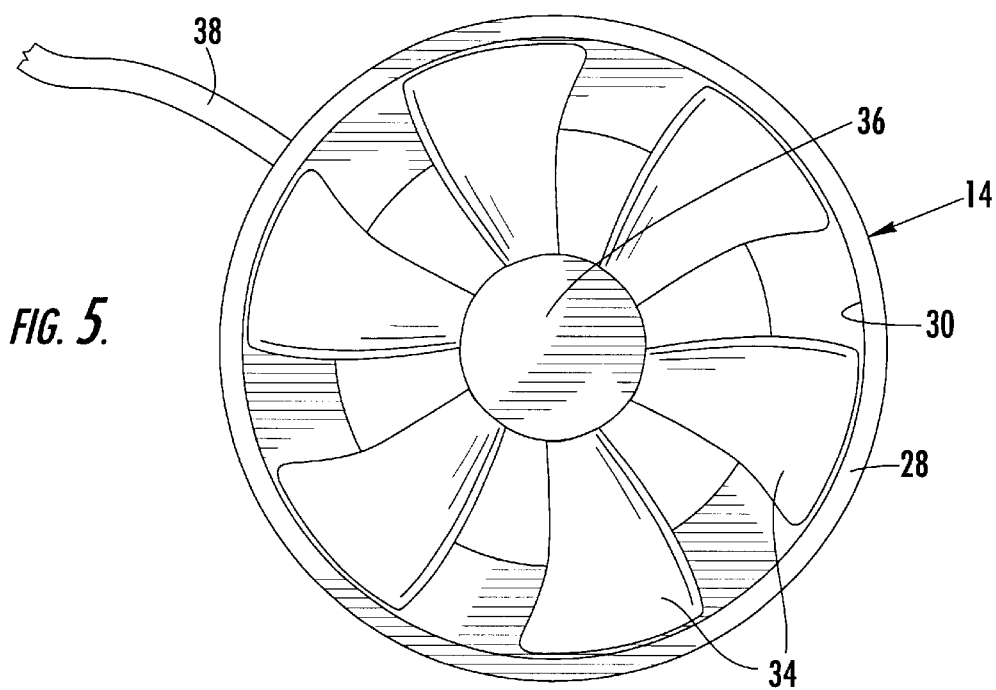
FIG. 5 is a top view of the fan module employed in the present invention.

As best seen in FIGS. 1, 4 and 5, the fan module 14 includes an outer housing 28 with a top open end 30 and a bottom open end 32. A number of fan blades 34 emanate outwardly from an electrical motor 36 that receives power via an electrical wire 38, as shown in FIG. 1. The fan blades 34 are preferably configured to blow air in a downward direction toward a semiconductor device 40; however, the fan blades 34 may be configured to pull hot air away from the semiconductor device 40 depending on the application. The motor 36 is preferably of the ball bearing type but may be other types and configurations. The fan module includes a base 33 with male threads 35 thereon.

Figure 2:
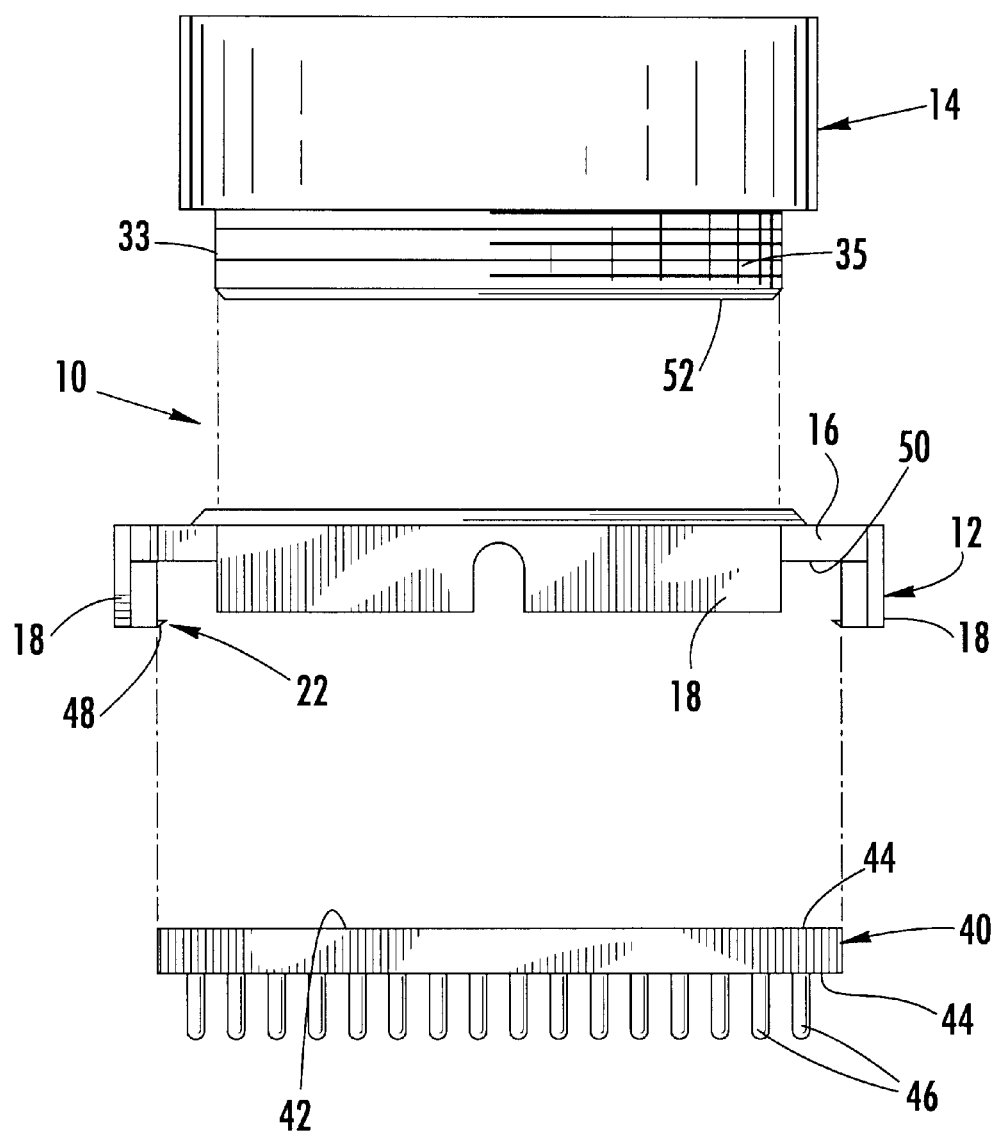
FIG. 2 is a side elevational view of the heat sink assembly of FIG. 1 being installed on a semiconductor device.
Figure 3:
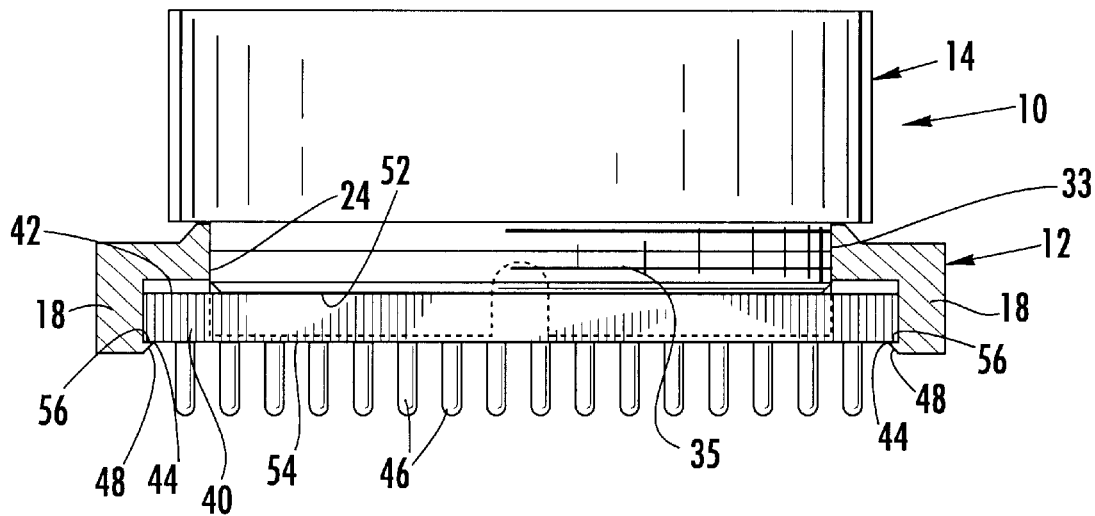
FIG. 3 is a cross-sectional view through the line 3—3 of FIG. 1, when the heat sink assembly is fully installed on a semiconductor device for cooling.

As shown in FIGS. 1–3, a PGA semiconductor device 40 is shown to include a top surface 42 with a peripheral region 44. Emanating downwardly from the semiconductor device 40 is an array of electrical contact pins 46 for interconnection of the semiconductor device 40 to a circuit board, or the like (not shown). The legs 18 of the retaining clip 12 are dimensioned to substantially mate with the configuration of the semiconductor device 40. For example, the distance between two opposing legs 18 are preferably slightly larger than the width of the semiconductor device 40. Also, the length of the legs 18 are at least greater than the thickness of the semiconductor device 40.

Referring now to FIGS. 1–3, attachment of the heat dissipation device 10 of the preferred embodiment of the present invention is shown. Preferably, the retaining clip 12 is pressed downwardly over the semiconductor device 40 so that the inwardly turned flanges 22 cam over the peripheral edges 44 of the semiconductor device 40 via angled surfaces 48 on the flanges 22. The camming action causes the legs 18 to bend outward slightly to allow the semiconductor device 40 to reside with the four downwardly depending legs 18 and between the inwardly turned flanges 22 and the bottom surface 50 of the central member 16 of the retaining clip 12.

The base 33 of the fan module 14 is threadably routed into the bore 24 through the retaining clip 12 so that the bottom edge 52 of the base 33 of the fan module 14 engages with the top surface 42 of the semiconductor device 40. Threaded installation of the base 33 of the fan module 14, causes the peripheral portion 44 of the bottom surface 54 of the semiconductor device 40 to seat on the top surfaces 56 of the flanges 22 of the downwardly depending legs 18 thus securing the fan module 14 in place on the semiconductor device 40. The fan module 14 may be easily tightened by hand to sufficient tension. Alternatively, the fan module 14 may be partially threaded into the bore 24 prior to installation of the retaining clip 12 over the semiconductor device 40. However, this will still require tightening of the base 33 of the fan module 14 to secure it in place on the semiconductor device 40.

The motor 36 of the fan module 14 receives electricity via the wire 38 which is connected to the power supply a computer (not shown) into which the semiconductor device 40 is installed. Upon the supply of electricity to the motor 36, the fan blades 34 rotate as desired imparting air flow to the semiconductor device 40. As a result, the semiconductor device 40 is cooled to avoid device failure. The heat dissipation device 10 is now securely connected to the semiconductor device 40. Since the preferred embodiment shown in FIGS. 1–3 is installed from above and requires no fasteners into the circuit board that carries the semiconductor device 40, it is particularly well suited for installation onto semiconductor devices 40 that are located in tight spaces within a computer.

Figure 6:
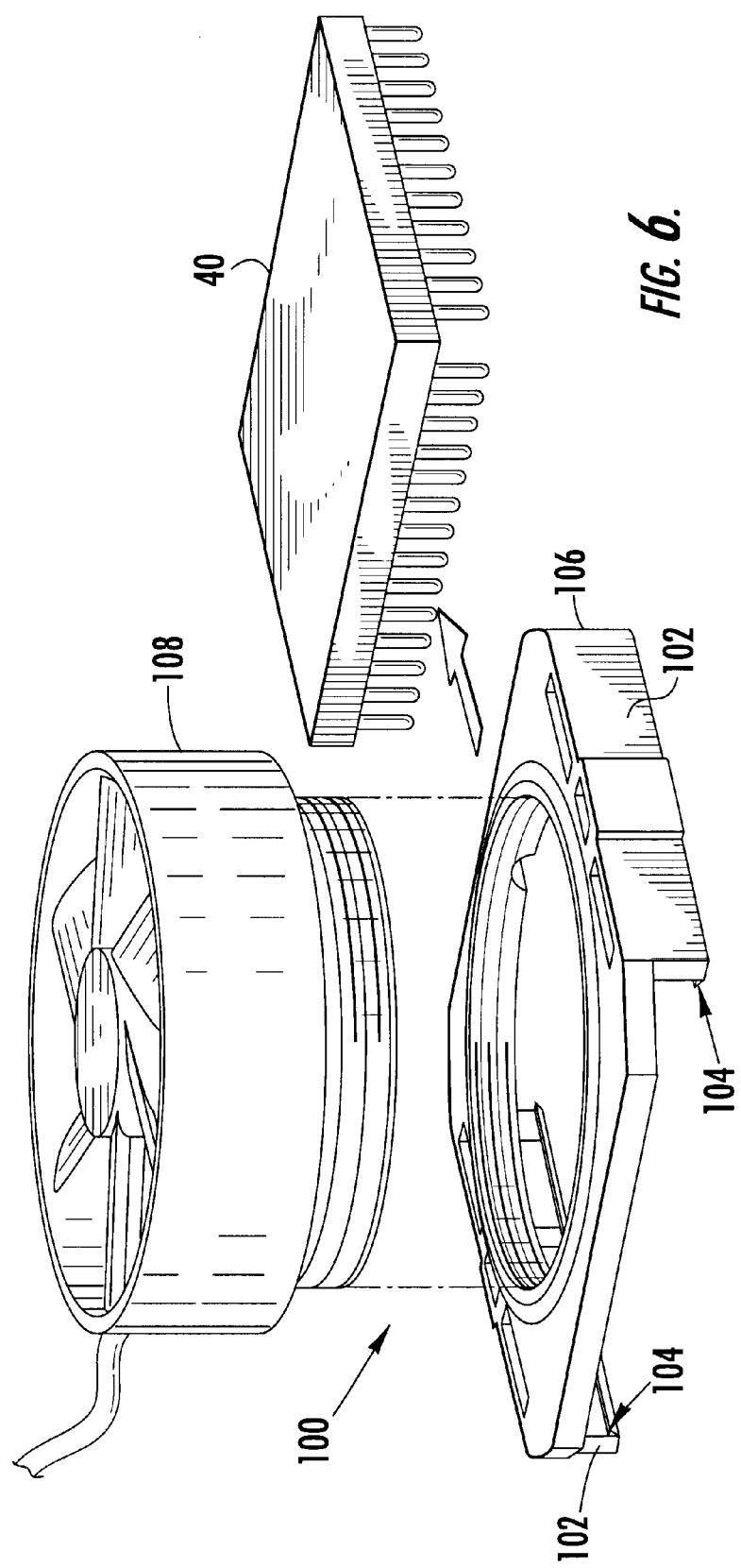
FIG. 6 is a an alternative embodiment of the heat sink assembly of the present invention with two legs for sliding onto a semiconductor device to be cooled.

Turning now to FIG. 6, an alternative embodiment 100 of the present invention is shown. This embodiment 100 includes a pair of legs 102 as opposed to four legs as shown in the preferred embodiment 10 of FIGS. 1–3. This embodiment 100 is slidable from the side onto a semiconductor device 40. Since this alternative embodiment 100 has open sides, it may be easily slid onto a semiconductor device 40 for cooling. While not specifically shown, three legs 102 and corresponding inwardly turned flanges 104 may be provided to allow for slidable installation of a the retaining clip 106 onto the semiconductor device 40. This sliding installation may be more desirable over the downward installation shown in FIGS. 1–3, such as when there is little space directly above the semiconductor device 40. The appropriate retaining clip 106 configuration is selected depending on the application at hand. The fan module 108 is installed and secured in place in the same fashion as described in detail above in connection with FIGS. 1–3.

A further alternative embodiment 200 of the present invention is shown in FIG. 7. This alternative embodiment 200 is the present invention modified to accommodate a semiconductor device 40 installed in a socket 202. This socket 202 is commonly referred to as a ZIF (zero insertion force) socket that includes protrusions 204 emanating therefrom. Only the front protrusion is visible in FIG. 7, however, another protrusion is located on the opposite side of the socket 202. In this alternative embodiment 200, the retaining clip 204 includes a pair of legs 206 with apertures 208 therethrough. Upon installation of the retaining clip 204 over the semiconductor device 40 installed in the socket 202, the protrusions 204 on the socket 202 snap into the apertures 208 in the legs 206 facilitated by cam surfaces 210 on the protrusions 204. This engagement secures the retaining clip 204 relative to the semiconductor device 204. The fan module 212 is installed and secured in place in the same fashion as described in detail above in connection with FIGS. 1–3.

It should be noted that various modifications of the retaining clips 12, 106 and 204 are shown and described herein; however, other connection methods and structures to secure the retaining clips 12, 106 and 204 relative to the semiconductor device 40 are also contemplated and within the scope of the present invention.

It is preferred that the retaining clips 12, 106 and 204 be manufactured of plastic material, such as a high temperature resistant and high creep resistant plastic for better withstanding the high temperatures associated with microprocessors. For example, the plastic material may be LNP VERTON UF700-10-HS (P.P.A. 50% long fiber) for use in high temperate heat dissipation applications. Alternatively, the retaining clips 12, 106 and 204 may be manufactured of metal, such as aluminum, depending on the application. The fan housing of fan modules 14, 108 and 212 is also preferably made of a suitable plastic for proper grounding and operation. The motor is preferably of a ball bearing type of known construction but may be other types depending on the application.

It should be understood that all of the threaded components of the present invention may include various types of threads which are envisioned and are deemed to be within the scope of the present invention. These various thread designs include continuous and interrupted threads. It is preferred that there be at least more than one turn to facilitate the adjustment of pressure. However, a single turn 360° thread, as well as half and quarter turn thread are considered to be within the scope of the present invention due to the ability to impart the desired pressure on the top surface of the semiconductor device. Further, bayonet-type attachment methods, which engage with ramped notches within a bore, are also considered to be threads which can provide a gradual, hand-controllable pressure in accordance with the present invention.

It would be appreciated by those skilled in the art that various changes and modifications can be made to the illustrated embodiments without departing from the spirit of the present invention. All such modifications and changes are intended to be covered by the appended claims.

What is claimed is:

1. A heat dissipation device for removing heat from an electronic device package, comprising:
    a semiconductor package having a peripheral region and a heat generating upper surface;
    a retaining clip, having a central member and a first pair of legs depending downwardly from respective opposing ends of said central member with ends of said pair of legs not connected to said central member being free ends, an aperture disposed through said central member defining a central member bore; female threading formed in said central member bore; means for securing said free ends of said pair of legs relative to said semiconductor device package; said central member bore being positioned substantially above said semiconductor package;
    a fan module having a threaded base portion, defining an air flow conduit, with a lower edge; said fan module being threadably received in said central member bore with said lower edge of said fan module in pressured communication with said upper surface of said semiconductor package with said air flow conduit of said fan module being disposed above and in fluid air communication with said heat generating upper surface of said semiconductor package; and
    whereby said fan module is secured to said semiconductor device for removing heat therefrom.

2. The heat dissipation device of claim 1, further comprising:
    a second pair of legs depending downwardly from respective opposing ends of said central member not occupied by said pair of legs.

3. The heat dissipation device of claim 1, further comprising:
    inwardly emanating flanges connected to said free ends of said legs and being engageable with said peripheral region of said semiconductor device.

4. The heat dissipation device of claim 1, wherein said fan module includes an electric ball bearing fan.

5. A heat dissipation device for removing heat from an electronic device package, comprising:
    a socket;
    a semiconductor package install ed in said socket; said semiconductor device having a peripheral region and a heat generating upper surface;
    a retaining clip, having a central member and a first pair of legs depending downwardly from respective opposing ends of said central member with ends of said pair of legs not connected to said central member being free ends, an aperture disposed through said central member defining a central member bore; female threading formed in said central member bore; means for securing said free ends of said pair of legs relative to said socket; said central member bore being positioned substantially above said semiconductor package;
    a fan module having a threaded base portion, defining an air flow conduit, with a lower edge; said fan module being threadably received in said central member bore with said lower edge of said fan module in pressured communication with said upper surface of said semiconductor package with said air flow conduit of said fan module being disposed above and in fluid air communication with said heat generating upper surface of said semiconductor package; and
    whereby said fan module is secured to said semiconductor device for removing heat therefrom.

6. The heat dissipation device of claim 5, wherein said means for securing said free ends of said pair of legs relative to said socket are protrusions emanating from said socket enagageable with said free ends of said pair of legs via apertures positioned at and defined by said free ends of said pair of legs.

7. The heat dissipation device of claim 5, wherein said fan module includes an electric ball bearing fan.

* * * * *